United States Patent [19]

Kupper

[11] Patent Number: 4,694,265

[45] Date of Patent: Sep. 15, 1987

[54] DEVICE FOR FILTERING A HIGH-FREQUENCY CONDUCTOR SUSCEPTIBLE TO ELECTROMAGNETIC INTERFERENCE OF A HIGH-FREQUENCY SPACE

[75] Inventor: Karl H. Kupper, Krefeld, Fed. Rep. of Germany

[73] Assignee: U.S. Philips Corporation, New York, N.Y.

[21] Appl. No.: 631,021

[22] Filed: Jul. 16, 1984

[30] Foreign Application Priority Data

Jul. 14, 1983 [DE] Fed. Rep. of Germany ....... 3325357

[51] Int. Cl.$^4$ .............................................. H03H 7/01
[52] U.S. Cl. ...................................... 333/185; 333/12; 333/181; 333/182
[58] Field of Search ............................... 333/167–172, 333/175–185, 12, 24 C, 24 R; 361/394, 400, 399, 415, 397, 424; 334/15, 85; 357/80; 174/50, 50.52, 51, 52 R, 52 FB, 65 R, 68.5

[56] References Cited

U.S. PATENT DOCUMENTS

| 3,566,203 | 2/1971 | Maguire et al. | 357/80 |
| 3,987,344 | 10/1976 | Ambruoso, Sr. et al. | 174/51 X |
| 4,320,364 | 3/1982 | Sakamoto et al. | 333/167 |
| 4,462,012 | 7/1984 | Kerber et al. | 333/185 X |
| 4,468,644 | 8/1984 | Teague et al. | 334/15 |

Primary Examiner—Marvin L. Nussbaum
Attorney, Agent, or Firm—Thomas A. Briody; William J. Streeter; Gregory P. Gadson

[57] ABSTRACT

The invention relates to a device for filtering a high-frequency conductor from a high-frequency space by a capacitor (71). The filtering capacitor (71) is in the form of a chip capacitor and is secured to a circuit board (1). A first contact surface (73) of the chip capacitor (71) is electrically contacted by soldering with the separation wall (19) closing the high-frequency space. The conductor (77) to be filtered is passed along a second contact surface (75) of the chip capacitor (71) so as to be electrically contacted by soldering along a largest possible surface. The conductor (77) to be filtered can be in the form of a planar conductor. The invention is applicable in particular in audio and video tuners.

1 Claim, 11 Drawing Figures

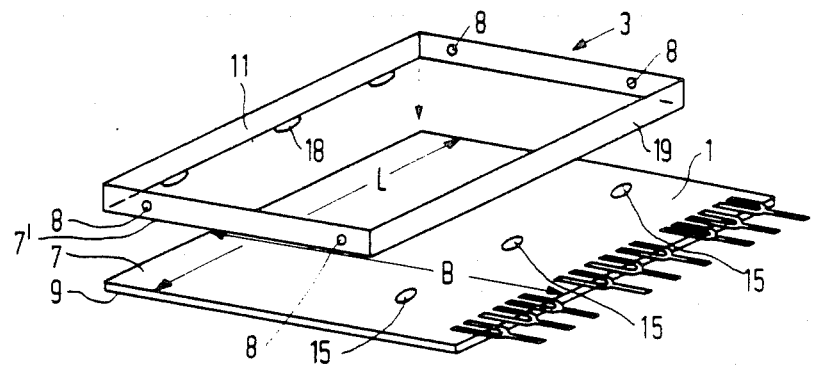
FIG.1
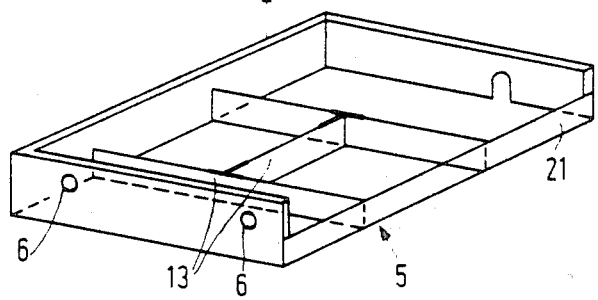
FIG.2
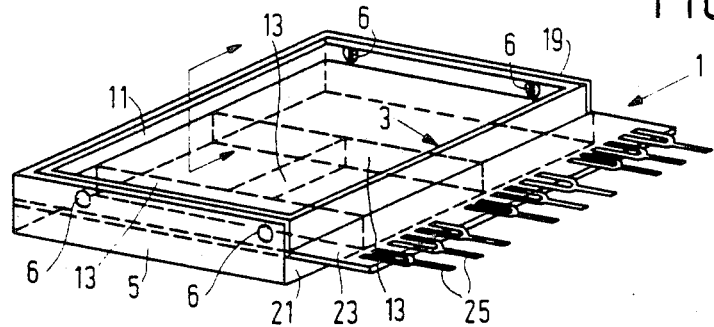
FIG.3
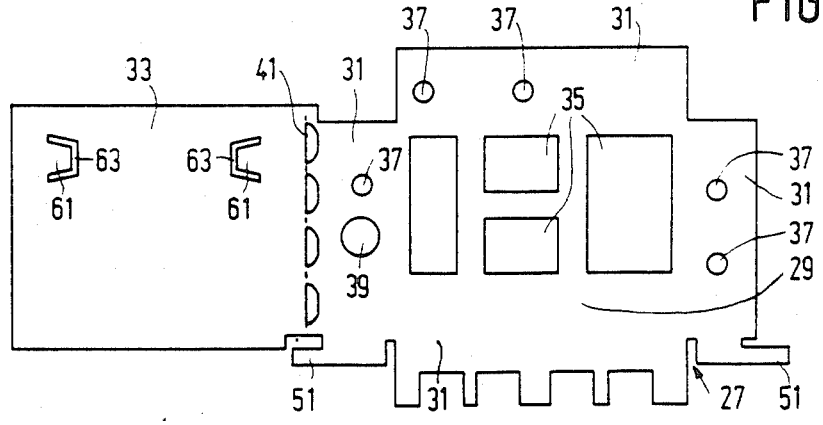

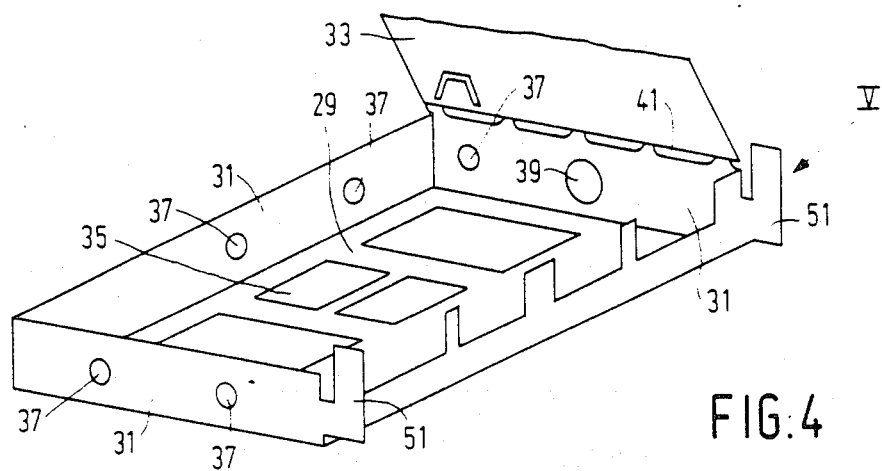
FIG.4
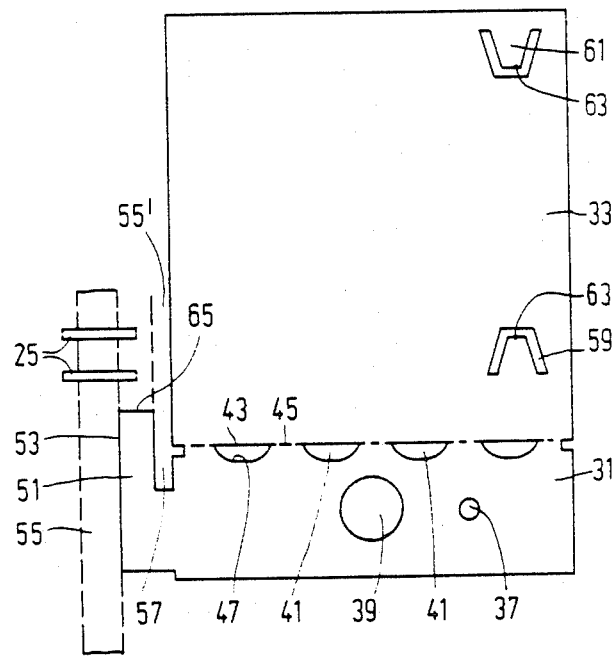
FIG.5
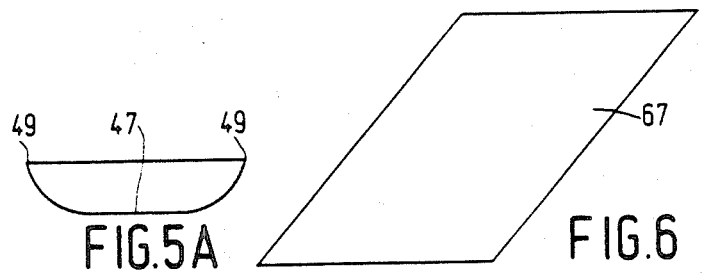
FIG.5A
FIG.6

DEVICE FOR FILTERING A HIGH-FREQUENCY CONDUCTOR SUSCEPTIBLE TO ELECTROMAGNETIC INTERFERENCE OF A HIGH-FREQUENCY SPACE

BACKGROUND OF THE INVENTION

The invention relates to a device for filtering a high-frequency conductor susceptible to electromagnetic interference of a high-frequency space comprising a filtering capacitor.

For filtering a high-frequency conductor from electromagnetic interference, it is known to utilize so-called feed-through capacitors (U.S. Pat. No. 4.173.745). The wall of the high-frequency space is penetrated by a tubular capacitor, through which the conductor is filtered. Such feed-through capacitors have the disadvantage that they can be mounted only by hand and that they require a hole in the wall of the high frequency space.

SUMMARY OF THE INVENTION

The invention has for its object to provide a filtering device for a high-frequency conductor, whose manufacture can take place in a completely mechanized manner and in which a perforation of the wall for insertion of the feed-through capacitor becomes superfluous.

According to the invention, this object is achieved in that a first contact surface of a chip capacitor arranged on a circuit board is electrically connected to a grounded wall of the high-frequency space and a second contact surface of the chip capacitor is electrically connected to the said high frequency conductor.

The chip capacitor can be electrically connected to the circuit board and to the separation wall by means of soldering which may be mechanized easily.

DESCRIPTION OF THE DRAWING

In order that the invention may be readily carried out, it will now be described more fully, by way of example, with reference to the accompanying drawings, in which:

FIG. 1 is a perspective exploded view of a subassembly of a tuning device;

FIG. 2 is a perspective view of the assembled tuning device of FIG. 1;

FIG. 3 shows the sheet metal blank of the housing made in one piece;

FIGS. 4, 5, and 5A are representations of the housing, in which the subassembly of FIGS. 1 to 3 is fixed by soldering;

FIG. 6 shows an adhesive foil serving as a metallic closure wall and as a type indication label;

DESCRIPTION OF THE PREFERRED EMBODIMENT

Figure 7:
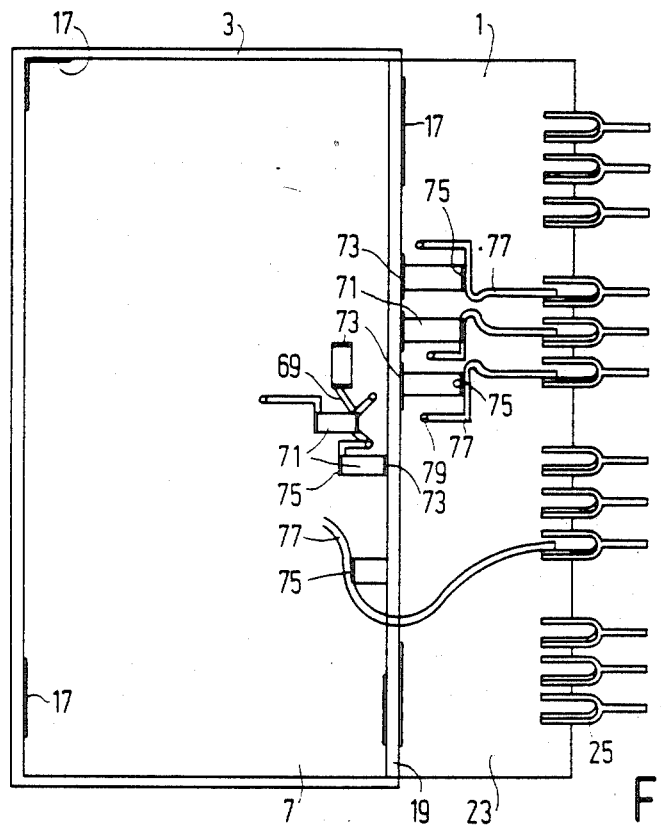
FIG. 7 is a plan view of the subassembly of FIG. 2 comprising the filtering device according to the invention.

With a view to peripheral groups in high-frequency apparatus, such as, for example, television apparatus or video apparatus, which become increasingly smaller, it is necessary to construct the individual peripheral structural groups as well as the tuning devices with smaller dimensions and to reduce the manufacturing cost by the use of processing operations that can be automatized. Such a tuning device should be limited, for example, to the dimensions of about 51×34×12 mm. In the conventional construction technique, construction and adjustment are difficult with such a miniaturization.

FIG. 1 is a perspective view of a subassembly with which it is possible to permit fluctuating dimension tolerances of a thick-film substrate 1. The thick-film substrate has, for example, a longitudinal dimension L of about 50 mm and a width dimension b of about 33 mm.

Two separation frames 3 and 5 form part of the subassembly and these frames can be soldered in a flat plane onto the thick-film substrate, having an immersion side 7 and a non-immersed side 9, with flat edges 8, which are free from mounting tongues. Before soldering, the substrate 1 and the separation frames 3 and 5 can be relatively displaced in a floating manner due to the flat engagement and due to the absence of mounting tongues, otherwise usual, so that tolerances can be readily compensated for. As is clearly apparent from FIGS. 2 and 10, the separation frame 3 may be slightly smaller than the separation frame 5. As a result, the separation frame 3 falls, during the assembly of the parts, down to the substrate 1 into the separation frame 5.

Figure 10:
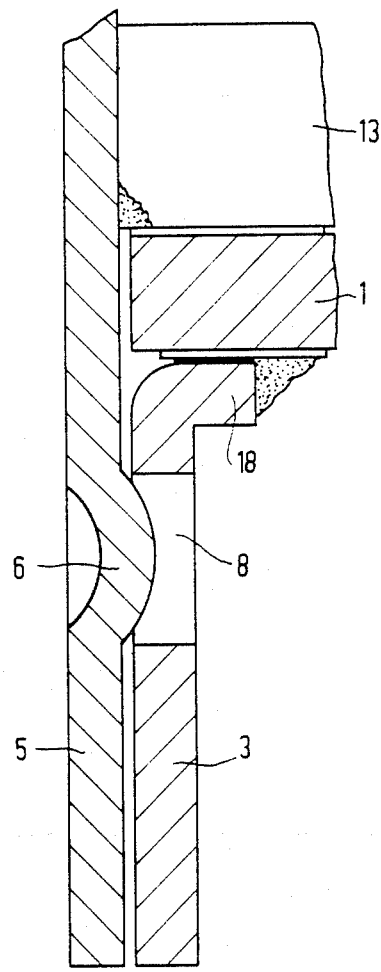
FIG. 10 shows on an enlarged scale a sectional view II—II of an edge of the subassembly according to FIG. 2 before soldering.

The floating arrangement, neutralizing tolerances, is further improved in that separation frames are provided outside three side edges of the circuit board (substrate 1) and overlap each other and in that the frames are relatively locked by means of snap connections in the overlap range before soldering. The edges of the circuit board consequently are always accessible so that the dimensions of the plate can fluctuate. FIG. 10 shows, by means of an enlarged sectional view, how the separation frames 3, 5 overlapping each other clamping the thick-film substrate 1 between them in a floating manner, and how the separation frame 5 engages, by a corrugation 6, a hole 8 of the separation frame 3, as a result of which the snap connection is established.

On the thick-film substrate 1 are disposed planar conductors (not shown), among which are also conductors which are at zero or ground potential. These conductors are partly arranged intentionally in a manner such that they form soldering surfaces with which the separation walls 11 of the separation frame 3 and the separation walls 13 of the separation frame 5 can be soldered. At the area at which such soldering surfaces are not present because of the circuit arrangement, particular separate soldering surfaces 15 (FIG. 1) are present, with which the separation frames 3 and 5 and the substrate 1 can be soldered to each other. Bent lobes 18 can be formed at the separation frame 3 and these lobes form widened soldering surfaces. The peripheral separation walls of the separation frames 3 and 5 extend, depending upon the tolerances of the thick-film substrate, exactly or approximately exactly along the edges of the substrate 1. Two separation walls 19 and 21 of the frames 3 and 5 form an exception however. These separation walls 19 and 21 permit a strip 23 of the thick-film substrate 1 to pass between them from the high-frequency space to the outside. Connection pins 25 are formed at this strip 23 of the substrate.

When the thick-film substrate 1 is fully equiped with electrical components in a manner to be described below, the separation frames 3 and 5 are soldered onto the substrate 1 with both sides 7 and 9, this soldering operation being effected together with the operation of soldering the said electrical components. A fully operable subassembly is then obtained, which, also without a housing and without closing covers, is fully operable. This subassembly can be readily electrically adjusted because all of its structural parts are accessible for adjustments and error controls.

FIG. 3 shows a lay-out of the housing into which the subassembly shown in FIGS. 1 and 2 can be inserted. This lay-out consists of a single sheet metal blank, for example of white iron. From this sheet metal blank 27 are formed the later bottom 29, the housing walls 31 and the housing cover 33. Windows 35 are provided in the bottom 29. The side walls 31 have soldering perforations 37 and one of the side walls has an antenna hole 39.

FIG. 4 now shows in perspective view how the sheet metal blank 27 of FIG. 3 is shaped into a housing by folding. The windows 35 are found at the bottom 29. In the side walls 31, the soldering perforations 37 are formed, while the cover 33 of the housing is connected fixedly, but so that it can be folded, to the antenna perforation 39 via folding perforations 41 at the housing wall 31.

In FIG. 5, an elevation in the direction of the arrow V in FIG. 4 is shown, from which it is particularly clearly apparent how the cover 33 of the housing is and remains homogeneously connected with one of the side walls 31. The antenna input is passed through the side wall 31. The homogeneous sheet metal transition from the cover via the side wall 31 to the bottom ensures a particularly high degree of freedom from high frequency interference effects. The folding perforations 41 each consist of a rectilinear stamping edge 43, which falls into the folding line 45. The other edge of the perforation 41, i.e. the arcuate edge 47, is bent mainly in the range of the ends 49 of the stamping edge 43.

The housing is provided with foot lobes 51 by cutting. These foot lobes 51 permit arranging the tuning device end up with a front edge 53 vertically on a circuit board 55 indicated in broken lines. The connection pins 25 can then be soldered into this circuit board 55. It is further possible to insert the tuning device, for example, into another circuit board 55', this circuit board 55' then penetrating into grooves 57 provided between the foot lobes and the housing wall 31.

When the cover 33 is pivoted onto the housing and when supporting lobes 61, constituted by U-shaped stamped parts 59, are bent out, the tuning device can be soldered at the front edges 63 of the supporting lobes 61 and the front surfaces 65 of the foot lobes 51 onto a circuit board at a certain distance from this board.

When the tuning device is fully tuned and ready for use, a metal foil 67 is adhered to the windows 35 and this foil closes the windows 35 and may be constructed at the same time as a type indication label. Thus, the operation of completely closing the tuning device and the operation of applying a type indication label can be efficiently combined.

Figure 8:
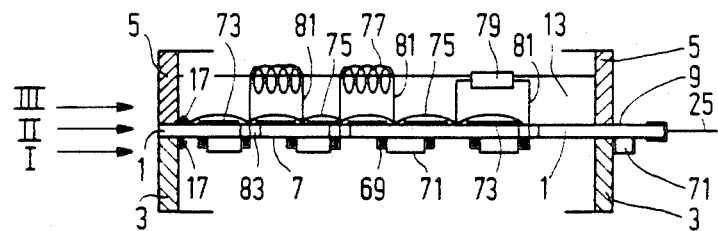
FIGS. 8 and 9 show the construction of the compact three-level arrangement with a circuit board.
Figure 9:
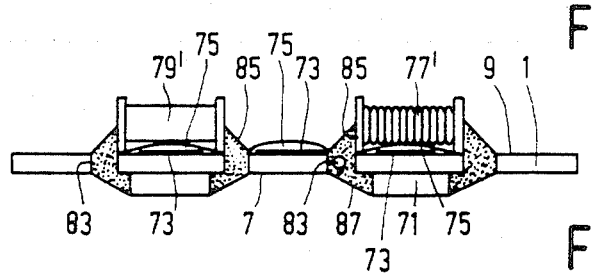

FIGS. 7 to 9 now show various circuit techniques with which it is possible to provide the circuitry of the tuner in a construction as compact as possible with simple structural elements and substantially fully automatically. The thick-film substrate 1 is shown in FIG. 7 in a flat plane from its immersion side 7. The metal frame 3 is soldered onto the thick-film substrate 1. Soldering surfaces 17 are shown diagrammatically. On the immersion side of the substrate are disposed conductor tracks 69 applied by a sintering method. The conductor tracks interconnect individual structural elements, such as chip film capacitors 71 (like multilayerfilm capacitors) located on the immersion side. The image of the conductors is not shown in detail because this is not essential to the explanation.

The connection pins 25 are formed at the strip 23 of the thick-film substrate 1 projecting via the separation wall 19 from the high-frequency space. It is shown for four of these connection pins how the high-frequency noise signals from the high-frequency space are practically short-circuited by the chip film capacitors in the range of the strips 23, as a result of which only filtered useful signals arrive at the connection pins 25. Chip film capacitors 71 and the separation wall 19 serve for filtering purposes. These chip film capacitors 71 are first adhered to the substrate 1 by means of conventional fixing methods. Each of the chip film capacitors 71 has two contact surfaces 73, 75. One contact surface 73 is each time soldered to the grounded high frequency screening separation wall 19 either outside or inside the separation wall 19. A conductor 77 to be filtered each time extends along the other contact surface 75. In order to obtain a satisfactory separation for high frequency, the conductors 75 extend as far as possible over the whole contact surface 75 of the chip film capacitors 71 and are satisfactorily contacted by soldering. The conductors 77 are also constructed as planar conductors. They are either introduced in an insulated manner between the separation wall 19 and the surface of the thick-film substrate into the high-frequency space or they are pulled, via lead-through members, onto the non-immersed side 9 by means of solder bridges 87 extending through solder bridge perforations 83 and are then introduced into the high-frequency space on the non-immersed side. These filtering members for high-frequency conductors correspond with respect to their function entirely to the usual tubular feed-through capacitors, but can be manufactured much more economically as compared with the latter.

FIG. 8 shows an arrangement of electrical components at three levels on a thick-film substrate 1 in order to attain a higher packing density and a simplified soldering operation. Planar conductors 69 are arranged on the immersion side 7 of the thick-film substrate in a manner indicated in FIG. 7. The planar conductors extend, of course, over the whole immersion side 7. After having been adhered, the chip film capacitors 71 are soldered to the planar conductors 69. Integrated circuits may also be provided on the immersion side 7. At the level of the arrangement denoted by I in FIG. 8, it is important at any rate that during soldering, only electrical components are provided that can be immersed in the soldering bath.

At a level II of the arrangement, which is situated directly on the non-immersed side 9 of the thick-film substrate 1, planar conductors are again applied by sintering. These conductors interconnect, in part, thick-film resistors 73. The level II of the arrangement is closed by means of a covering insulating layer 75. Only at the third level of the arrangement III are situated individual electrical components that cannot be immersed, such as coils 77, lacquer resistors, diodes and further integrated circuits 79. These components have connection feet 81 which extend through solder bridge perforations 83 of the thick-film substrate 1 to the immersion side 7. On this immersion side 7 the connection feet 81 can be soldered to conductors 69 on the immersion side 7.

The operation of soldering the thick-film substrate 1 together with the frames 3 and 5 is effected in a single immersionsoldering process, without it being necessary for the thick-film substrate to be turned over. Such a method leads to considerable savings. The thick-film substrate is immersed with its immersion side 7 in the immersion soldering bath. The contact surfaces of the chip film capacitors 71 are then soldered on the immersion side to the planar conductors 69. Of course inserted connection feet of integrated circuits are also soldered to the planar conductors. The thick-film substrate is immersed so deeply that the solder penetrates through the solder bridge perforations 83 as far as the non-immersed surface 9. The parts of the soldering surfaces 17 free from the covering layer 75 can then be soldered on this surface to the frames 5 and 3. Consequently, for the whole soldering operation, only one immersion process is required to carry out all the soldering steps on both sides.

FIG. 9 shows a modification of separate electrical components 77' and 79'. On the immersion side 7 of the thick-film substrate 1, chip film capacitors 71 are adhered and then soldered, as in FIG. 8. The individual components 77' and 79' have upset connections 85. These connections 85 are upset in such a manner that they cannot be passed through the solder bridge perforations 83, but remain on the non-immersed side 9 of the thick-film substrate 1. During immersion, also in this case solder bridges 87 will rise vertically upwards through the thick-film substrate 1 and will be soldered to the upset connections on the non-immersed side 9. It is of course important that the thick-film substrate 1 is immersed so deeply that a sufficient quantity of solder can emanate on the non-immersed side 9 from the solder perforation 83 in order that a soldering connection with the upset connections 85 can be established.

During the immersion of the thick-film substrate 1, an additional advantage is obtained with respect to the conduction resistance of the sintered planar conductors. On the immersion side 7, these sintered planar conductors are also coated with solder. As a result, the conduction resistance of these planar conductors decreases.

During soldering, it has of course to be ensured that the covering lacquer layer 75 does not cover, on the non-immersed side 9, the soldering surfaces 17 for the frames 3 and 5 and that the contact soldering surfaces for the individual electrical components 77' and 79' with their upset connections must be accessible for soldering.

What is claimed is:

1. A device for leading a high-frequency conductor out of a shielded high-frequency space, comprising a filtering capacitor that is arranged in the area where the conductor passes through a grounded wall, and that is electrically coupled to said grounded wall, wherein the conductor to be led out of the shielded high-frequency space is a planar conductor carried by a circuit board, and said filtering capacitor comprises a chip film capacitor mounted on a side of said circuit board preselected for immersion in a soldering bath to the exclusion of the other side, said chip film capacitor for filtering the high-frequency conductor from electromagnetic interference, wherein a first contact surface of said chip film capacitor is coupled to said grounded wall of the shielded high-frequency space and a second contact surface of said chip film capacitor is electrically coupled to said high-frequency conductor.

* * * * *